(12) United States Patent  (10) Patent No.: US 8,198,952 B2
Koreyasu et al.  (45) Date of Patent: Jun. 12, 2012

(54) HIGH FREQUENCY LIMITER

(75) Inventors: Misa Koreyasu, Nishinomiya (JP); Tetsuya Takashima, Nishinomiya (JP)

(73) Assignee: Furuno Electric Co., Ltd., Nishinomiya (JP)

( * ) Notice: Subject to any disclaimer, the term of this patent is extended or adjusted under 35 U.S.C. 154(b) by 250 days.

(21) Appl. No.: 12/663,190

(22) PCT Filed: Jun. 4, 2008

(86) PCT No.: PCT/JP2008/060277
§ 371 (c)(1),
(2), (4) Date: Dec. 4, 2009

(87) PCT Pub. No.: WO2008/149893
PCT Pub. Date: Dec. 11, 2008

(65) Prior Publication Data
US 2010/0182108 A1    Jul. 22, 2010

(30) Foreign Application Priority Data

Jun. 5, 2007  (JP) .................................. 2007-149673
May 7, 2008  (JP) .................................. 2008-121095

(51) Int. Cl.
*H01P 1/22*  (2006.01)
(52) U.S. Cl. ..................................... 333/17.2
(58) Field of Classification Search .............. 333/17.2, 333/81 A, 81 R; 327/309
See application file for complete search history.

(56) References Cited

U.S. PATENT DOCUMENTS 4,292,610 A  9/1981 Makimoto et al.
6,057,569 A  5/2000 Kisanuki et al.

FOREIGN PATENT DOCUMENTS

| CN | 1208971 | | 2/1999 |
|---|---|---|---|
| GB | 2 328 325 | A | 2/1999 |
| JP | 50-115956 | A | 9/1975 |
| JP | 55-100701 | A | 7/1980 |
| JP | 6-216685 | A | 8/1994 |
| JP | 7-22249 | B2 | 3/1995 |
| JP | 7-85521 | B2 | 9/1995 |
| JP | 11-41049 | A | 2/1999 |

OTHER PUBLICATIONS

Nippon Foundation Library, "2003 Marine Vessel Electrical Equipment Technical Lecture for Correspondence Course (Radar and Instrument Maintenance Edition), 4.3, Transmission-and-reception Switching Circuit," [Online], [Searched on May 7, 2007], pp. 1-3, Internet, <http://nippon.zaidan.info/seikabutsu/2003/00138/contents/0020.htm>.

*Primary Examiner* — Stephen Jones
(74) *Attorney, Agent, or Firm* — Birch, Stewart, Kolasch & Birch, LLP

(57) ABSTRACT

In order to provide a high-frequency limiter capable of absorbing variation in characteristic parameters of a PIN diode to acquire a desired limiting characteristic, an external re-entrant coaxial cavity is constituted by an external pedestal 15 and a cavity 34 inside a lower conductor part 13 and an upper conductor part 14, and an internal re-entrant coaxial cavity is constituted by an inner wall of the external pedestal 15 and by an internal pedestal 16 and a post 17. A PIN diode 18 is joined between the post 17 and the internal pedestal 16. Resonance windows 11 and 12 are provided between the resonator part and a waveguide connected thereto. A projected amount x of the external pedestal 15 with respect to the cavity 34 and an insertion amount y of the post 17 into the external pedestal 15 are adjustable independently. Further, a partition 30 is provided between each of the resonance parts 10 and 20 to form a coupling hole 60, and electromagnetic fields of the adjacent resonance parts 10 and 20 are made to be an even mode coupling, and thereby, the coupling hole 60 has a low-pass characteristic. Thus, generation of unnecessary resonance mode can be suppressed and a band expansion of a cutoff characteristic can be realized.

6 Claims, 17 Drawing Sheets

HIGH FREQUENCY LIMITER

TECHNICAL FIELD

The present invention relates to a high-frequency limiter for suppressing the maximum power of a propagating high frequency signal.

BACKGROUND ART

Conventionally, a transceiving device, such as a radar device, for transmitting and receiving high-power high-frequency signals using an antenna for both transmission and reception is provided with a high-frequency limiter in a route of the received signals (refer to Nonpatent Document 1).

FIG. 1 is a block diagram showing an example of arrangement of a conventional common high-frequency limiter. In FIG. 1, an oscillation signal of a magnetron 101 is transmitted from an antenna 103 via a circulator 102. The signal reflected on a target object and received by the antenna 103 passes through a high-frequency limiter 104 via the circulator 102, and is then given to a reception module 105.

The limiter 104 protects the reception module 105 from high-power microwaves directly reflected on the antenna 103 or high power microwaves inputted after directly leaked from the circulator 102, and typically uses a PIN diode. The PIN diode functions as a switch for switching on and off according to the input power, and at the time of a high-power input, the PIN diode is switched to on to short-circuit the circuit to achieve a function of the limiter. Such a characteristic is referred to as a "cutoff characteristic. On the other hand, for a small-power input, such as a reflected wave from a target object, the PIN diode turns off, and a signal component is inputted into the reception module 105 as it is without attenuating. Such a characteristic is referred to as a "transmission characteristic."

FIG. 2 is a cross-sectional view showing a configuration example of the high-frequency limiter 104 shown in FIG. 1. A tuning block 2 formed with a post 3 projecting from a central part thereof is provided at a predetermined position of a waveguide section 1. A turning choke 5 is provided in a tip-end part of the post 3, and a limiter diode 4 is inserted in an intermediate part of the post 3.

Nonpatent Document 1: Nippon Foundation Library "2003 Marine Vessel Electrical Equipment Technical Lecture for Correspondence Course (Radar and Instrument Maintenance Edition), 4·3, Transmission-and-reception Switching Circuit," [Online], [Searched on May 7, 2007], Internet <http://nippon.zaidan.info/seikabutsu/2003/00138/contents/0020.htm>

FIG. 16 is views showing a configuration of a conventional waveguide-type high-frequency limiter constituted by using a PIN diode, where FIG. 16(a) shows a cross-sectional view and FIG. 16(b) shows a side view.

In a high-frequency limiter 400 shown in FIG. 16, a diode 401 having a thick I-layer with a sufficient power-proof characteristic is arranged inside a resonance part 403, and a diode 402 having a thin I-layer with a sufficient cutoff characteristic is arranged inside a resonance part 404. Thus, the resonance part 403 and the resonance part 404 are electrically coupled to simultaneously realize tolerance over high power and a short response time (sufficient cutoff characteristic).

Further, an interval between the resonance parts 403 and 404 is set to an odd number multiple of ¼ wavelength of an electromagnetic wave outputted and inputted to constitute a ¼-wave coupled circuit. By constituting as above, because phases of reflected waves reflected on the respective resonance parts are inverted, the reflected waves cancel each other to make matching conditions and thereby input signals are inputted into the circuit without loss.

[Patent Document 1] JP1995-85521(B)
[Patent Document 2] JP1995-22249(B)

DISCLOSURE OF THE INVENTION

Problems to be Solved by the Invention

Generally, if there is a change in a manufacturing method or a shape (lot change) of the PIN diode, the limiting characteristic will change significantly. A limiting characteristic of the high-frequency limiter can be adjusted to some extent by adjusting an attaching height of the PIN diode; however, if the lot change takes place as described above, a conventional adjustment mechanism cannot function properly and there may be a case where a desired limiting characteristic is not acquired. For this reason, the design of the high-frequency limiter may need to be changed or the required specification over the PIN diode may become stricter to increase the cost.

Further, when the coupling of the resonance parts is made as described above, the matching conditions can only be made at a single point of frequency where the distance between the resonance parts becomes a ¼ wavelength and, thus, the matching conditions cannot be made for other frequencies. Therefore, although the loss increases only in a certain frequency range (area A) having a transmission characteristic and a cutoff characteristic of a narrow band as shown in FIG. 17, and especially has the cutoff characteristic, the loss will be smaller in other frequency ranges (area B). When such a high-frequency limiter 400 is used with a radar device, unnecessary signals, such as leaky signals, cannot fully be attenuated at a frequency (area B) which is higher than a basic transmission frequency (area A) of a magnetron. For this reason, when a frequency component of the area B is inputted with high power, the reception module 105 may be damaged.

Therefore, the purpose of the present invention is to provide a high-frequency limiter capable of securing a large adjustable range of the limiting characteristic to absorb variation in characteristic parameters of the PIN diode nearly completely to acquire the desired limiting characteristic.

Another purpose of the present invention is to provide a high-frequency limiter capable of suppressing generation of unnecessary resonance mode to expand the cutoff characteristic in band.

Means for Solving the Problems

In order to solve the problems, the present invention is constituted as follows.

(1) A high-frequency limiter for limiting power of a high frequency signal propagating in a waveguide at a predetermined upper limit, includes a resonator part to which a first (input-side) waveguide into which the high frequency signal comes and a second (output side) waveguide for outputting the high frequency signal to be propagated are connected. The resonator part includes at least one multi section re-entrant coaxial cavity. The multi section re-entrant coaxial cavity includes an internal re-entrant coaxial cavity having a central conductor and a pedestal opposing to the central conductor, that are coaxially arranged, and an external re-entrant coaxial cavity having a cavity of the resonator part and the pedestal. A PIN diode is connected between the central conductor and the pedestal of the internal re-entrant coaxial cavity, and the PIN diode is provided so as to adjust individually a projected amount of the central conductor toward the internal re-entrant coaxial cavity and a projected amount of the pedestal with respect to the cavity (a position of an open part of the external re-entrant coaxial cavity.

(2) The resonator part may include a first resonator part to which the first (input-side) waveguide into which the high frequency signal comes is connected, and a second resonator part coupled with the first re-entrant coaxial cavity and to which the second (output-side) waveguide for outputting the high frequency signal to be propagated is connected. The first and second resonator parts may have different inner diameters of the cavity from each other.

(3) The high-frequency limiter may include a first resonance window for matching conditions between the first waveguide and the first resonator part, a second resonance window for matching conditions between the second waveguide and the second resonator part, and a third resonance window for matching conditions between the first and second resonator parts.

(4) A partition provided between the first resonance part and the second resonance part may be formed with a coupling hole for intercepting a high-frequency range component higher than a predetermined frequency.

(5) The coupling hole may couple electromagnetic fields of the adjacent resonance parts in an even mode. It may suppress unnecessary resonance mode to realize a sufficient cutoff characteristic.

(6) The coupling hole may have a rectangular shape.

Effects of the Invention

According to the present invention, the following effects can be accomplished.

(1) For the internal re-entrant coaxial cavity of the multi section re-entrant coaxial cavity, because the projected amount (y) of the central conductor to the internal re-entrant coaxial cavity and the projected amount (x) of the pedestal with respect to the cavity (the position of the open part of the external re-entrant coaxial cavity) can be adjusted individually, a Q value of the resonator can be changed, and thereby, a voltage applied to the PIN diode can be controlled to allow a limiting characteristic to be adjusted broadly.

As a result, variation in characteristics of the diode due to a lot change of the PIN diode or the like can be absorbed, and a high-frequency limiter capable of adjusting to desired characteristics can be constituted.

(2) By changing the inner diameter of the external re-entrant coaxial cavity of the multi section re-entrant coaxial cavity, because the characteristic impedances of the internal re-entrant coaxial cavity and the external re-entrant coaxial cavity change, and the power applied to the diode changes, the limiting characteristic can be adjusted for each re-entrant coaxial cavity.

For this reason, by configuring the two re-entrant coaxial cavities to have different inner diameters from each other (they form different resonance systems from each other), the limiting characteristic of each resonator can be adjusted individually, and, as a result, the characteristics of the entire high-frequency limiter can be adjusted more broadly.

(3) Between the first waveguide and the first re-entrant coaxial cavity, between the second waveguide and the second re-entrant coaxial cavity, and between the first and second re-entrant coaxial cavities, a resonance window for matching conditions is provided, respectively. Therefore, a mode conversion between the waveguides and the re-entrant coaxial cavities can be performed appropriately and insertion loss can be reduced.

(4) The partition is provided between the respective resonance parts and a coupling hole is formed therein. The electromagnetic fields of the adjacent resonance parts are made in an even mode coupling. Therefore, a low-pass characteristic can be given to the coupling hole. Thereby, because a low-pass characteristic can be given to the high-frequency limiter, unnecessary resonance mode can be suppressed and sufficient transmission and cutoff characteristics can be obtained.

BEST MODES FOR IMPLEMENTING THE INVENTION

<<First Embodiment>>

Figure 1:
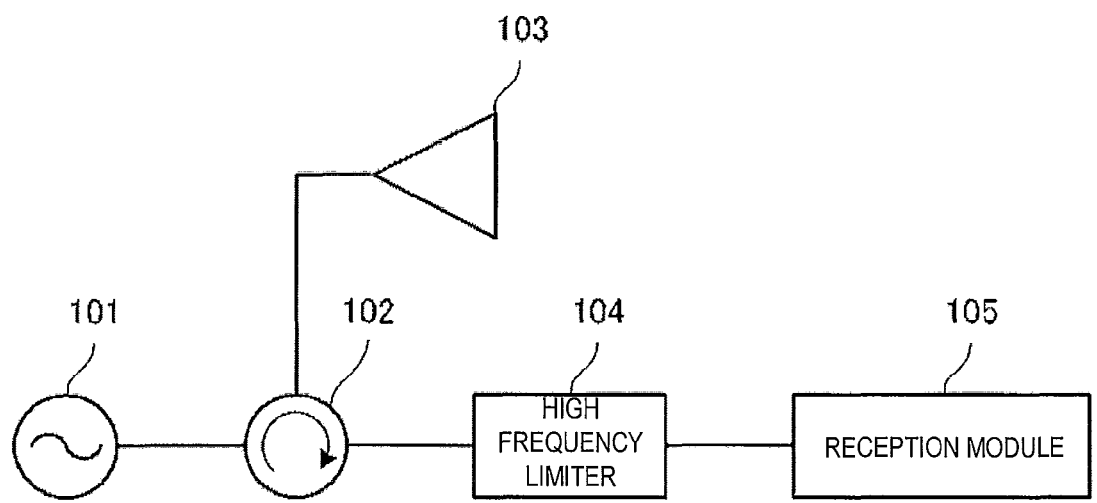
FIG. 1 is a block diagram showing a configuration including a transmission-and-reception switching circuit part in a conventional common radar device.
Figure 2:
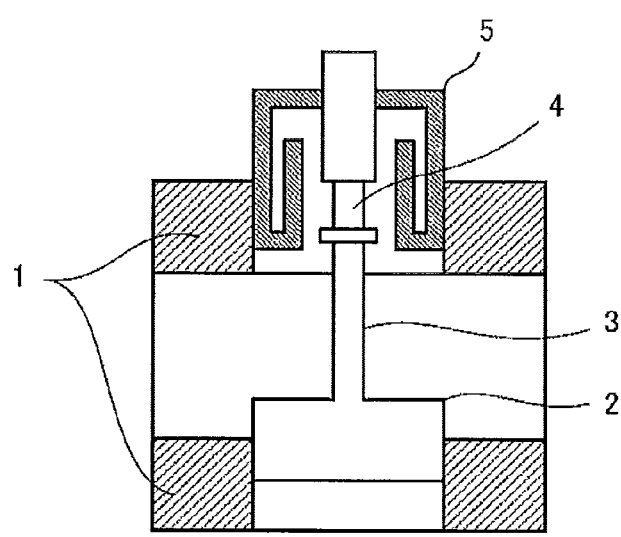
FIG. 2 is a cross-sectional view of a high-frequency limiter portion of the circuit.
Figure 3:
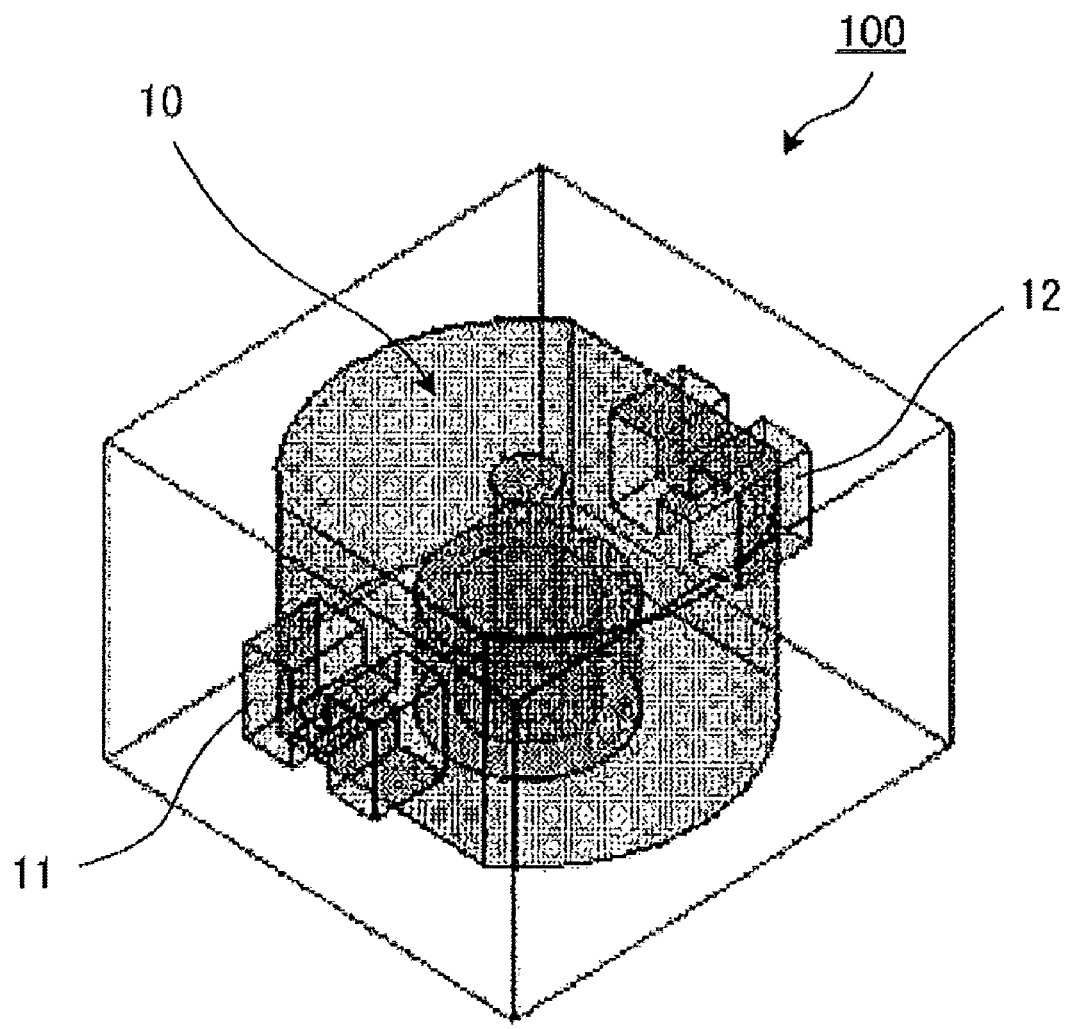
FIG. 3 is a transparent perspective view of a high-frequency limiter according to a first embodiment.
Figure 4:
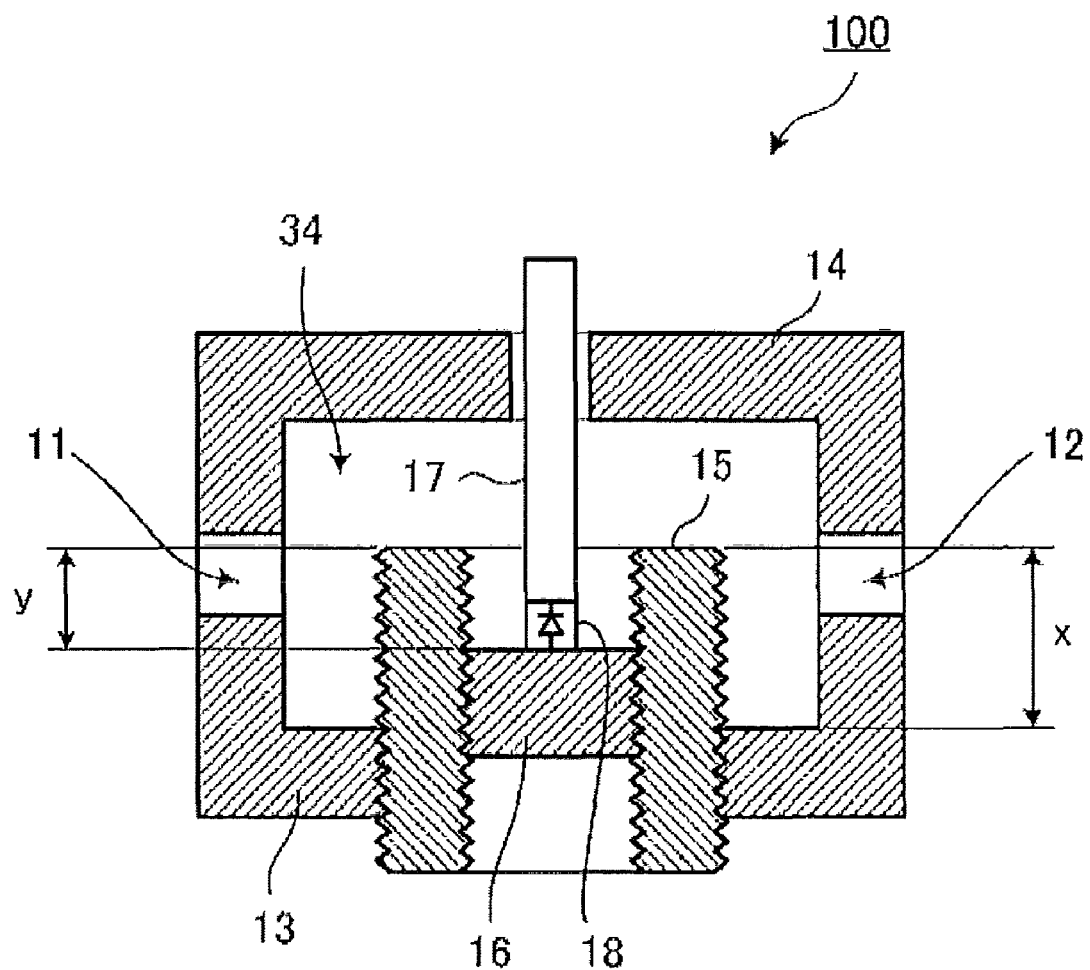
FIG. 4 is a cross-sectional view of the high-frequency limiter.

FIG. 3 is a transparent perspective view of a high-frequency limiter according to a first embodiment. FIG. 4 is a longitudinal cross-section of a central part thereof.

The high-frequency limiter 100 shown in FIG. 3 and FIG. 4 is arranged between a circulator and a reception module, and is connected with a waveguide which propagates a received signal. As shown in FIG. 3, this high-frequency limiter 100 includes resonance windows 11 and 12 arranged between the resonator part 10 and two waveguides.

As shown in FIG. 4, the resonator part 10 shown in FIG. 3 is configured in a cylindrical cavity 34 having a lower conductor part 13 and an upper conductor part 14. Inside of the cavity 34, an external pedestal 15 projecting inwardly from the side of the lower conductor part 13 is provided. The periphery of the external pedestal 15 and a hole of the lower conductor part 13 are formed with threads for threadedly engaging with each other.

A post 17 (central conductor) projecting from the side of the upper conductor part 14 is provided inside the cavity 34 described above. In a lower end part of the post 17, an internal pedestal 16 is arranged, and a PIN diode 18 is joined integrally between the internal pedestal 16 and the lower end part of the post 17. Threads for threadedly engagement with each other are formed on the periphery of the internal pedestal 16 and an inner circumferential face of the external pedestal 15.

The cavity 34 and the external pedestal 15 constitute an external re-entrant coaxial cavity, and the inner circumferential face of the external pedestal 15 and the post 17 constitute an internal re-entrant coaxial cavity.

By turning the external pedestal 15, a projected amount (x) of the external pedestal 15 can be adjusted with respect to the cavity 34, and moreover, by turning the post 17, a projected amount $y_{[pto1]}$ of the post 17 toward the internal re-entrant coaxial cavity can be adjusted. In addition, the above x and y can be adjusted independently.

When pulse power is inputted into the high-frequency limiter 100 via a resonance window 11, voltage is applied between the post 17 and the internal pedestal 16, and the PIN diode 18 shown in FIG. 4 changes its joint capacity, and a joint characteristic with the waveguide changes significantly to reflect the input power.

Q values of the resonators (the external re-entrant coaxial cavity and the internal re-entrant coaxial cavity) change according to adjustment of the dimensions x and y. Because the voltage applied to the PIN diode 18 changes according to the Q values of the resonators, the limiting characteristic can be adjusted broadly by adjusting the dimensions x and y described above.

FIG. 5 is views showing characteristics of three high-frequency limiters which are different from each other in a size of the cavity 34. When an inner diameter of the cavity is herein expressed as L, M, and S, they are L=23.0 mm, M=20.0 mm, and S=17.0 mm.

Figure 5A:
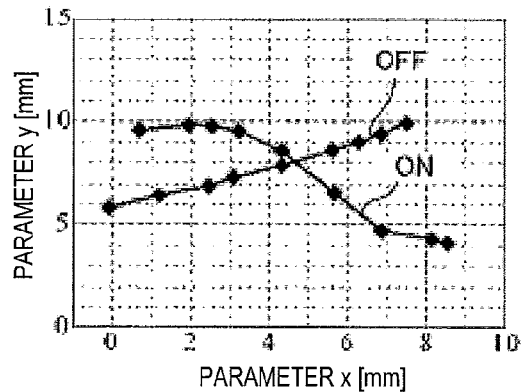
FIG. 5 is a view showing various examples of characteristics of the high-frequency limiter.
Figure 5B:
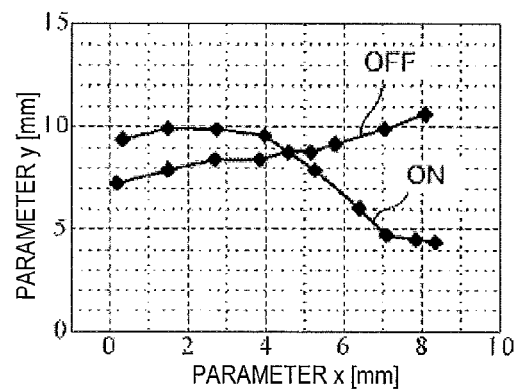
Figure 5C:
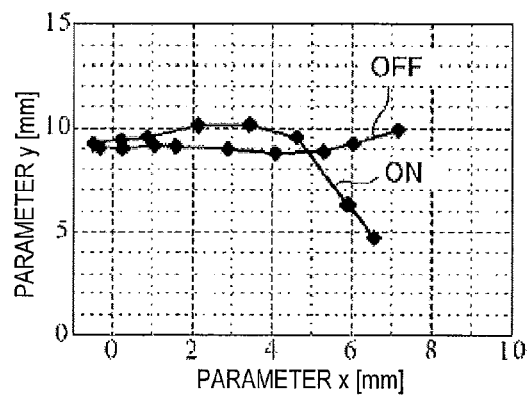

FIG. 5(A) is a characteristic of the cavity size L, FIG. 5(B) is a characteristic of the cavity size M, and FIG. 5(C) is a characteristic of the cavity size S. In these figures, curves shown by ON each indicates a relation of the dimensions x and y in which an insertion loss becomes the maximum when the PIN diode is in an ON state, and curves shown by OFF each indicates a relation of the dimensions x and y in which a return loss becomes the minimum when the PIN diode is in an OFF state. Note that a frequency used is 9.41 GHz.

Figure 5D:
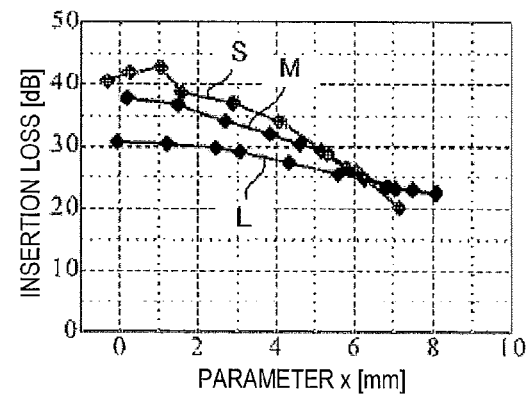
Figure 5E:
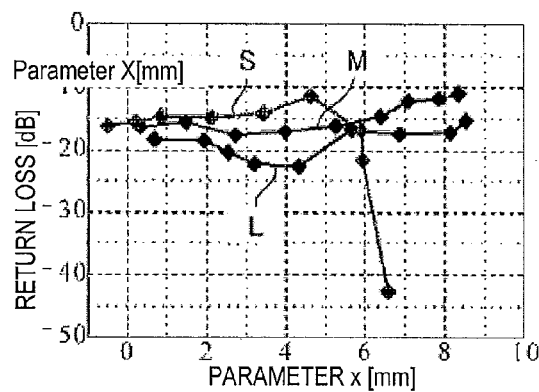

FIG. 5(D) is a characteristic of the insertion loss when the PIN diode is ON, and FIG. 5(E) is a characteristic of the return loss when the PIN diode is OFF. The sizes of the cavity are expressed as L, M, and S.

When using as a high-frequency limiter, it is necessary to have both a characteristic in which the insertion loss needs to be small when the PIN diode is OFF and a characteristic in which the insertion loss needs to be large when the PIN diode is ON. Therefore, the intersection of the characteristic curve at the time of ON and the characteristic curve at the time of OFF in FIGS. 5(A) to (C) will be optimal sizes of x and y.

From FIG. 5, it can be seen that the characteristic change with respect to x and y dimensions tends to be larger as the inner diameter of the cavity becomes smaller, and the insertion loss tends to be larger as the inner diameter of the cavity becomes smaller.

This is because that, as the inner diameter of the cavity becomes smaller, the resonance windows and the resonant circuit therein approach mutually to make the coupling state complicated, and thereby it can be considered that characteristic changes of the return loss and the insertion loss become larger. Further, C-shaped resonance windows can also be adopted as the shape of the resonance windows 11 and 12 shown in FIG. 3 other than what are called H-shaped resonance windows. However, in the case of the C-shaped resonance windows, the coupling state of gap parts of the resonance windows and the resonant circuit differ greatly according to the assemble method. Therefore, the characteristic change with respect to an accuracy of the assembly will be large. For this reason, the resonance windows are preferred to be H-shaped resonance windows.

From the above, when a high-harmonic limiter is constituted with a single resonator part 10, the insertion amount of the external pedestal 15 shown in FIG. 4 into the cavity 34 and the insertion amount of the post 17 into the external pedestal 15 may respectively be adjusted so that the optimal x and y dimensions are obtained according to the size of the cavity.

Meanwhile, when the inner diameter of the cavity 34 is changed, the characteristic impedances of the internal re-entrant coaxial cavity and the external re-entrant coaxial cavity change and the voltage applied to the diode changes (the voltage applied to the diode will be larger as the diameter is made smaller).

The limiting amount will be larger as the inner diameter of the cavity 34 becomes smaller. This can be considered to be due to the voltage applied to the diode will be larger as the inner diameter is made smaller, as described above.

Although the Q value of the re-entrant coaxial cavity (which is a state where the inner resonator and the outer resonator are combined) changes by changing the dimensions x and y (especially, the dimension x) shown in FIG. 4, the limiting amount will be larger as the Q value becomes lower and the limiting amount will be smaller as the Q value becomes higher. This is because sensitivity will be better as the Q value becomes higher to allow electric current to flow into the diode to increase the limiting amount, and the reverse relation can be obtained when the Q value is lower.

Thus, by the selection of the inner diameter of the cavity and the adjustment of the dimension x, the voltage applied to the PIN diode 18 can be controlled to set to the desired limiting amount. According to the dimension x, an optimal dimension y to make the return loss minimum when the diode is off and to make the insertion loss maximum when the diode is on can be determined.

<<Second Embodiment>>

Figure 6:
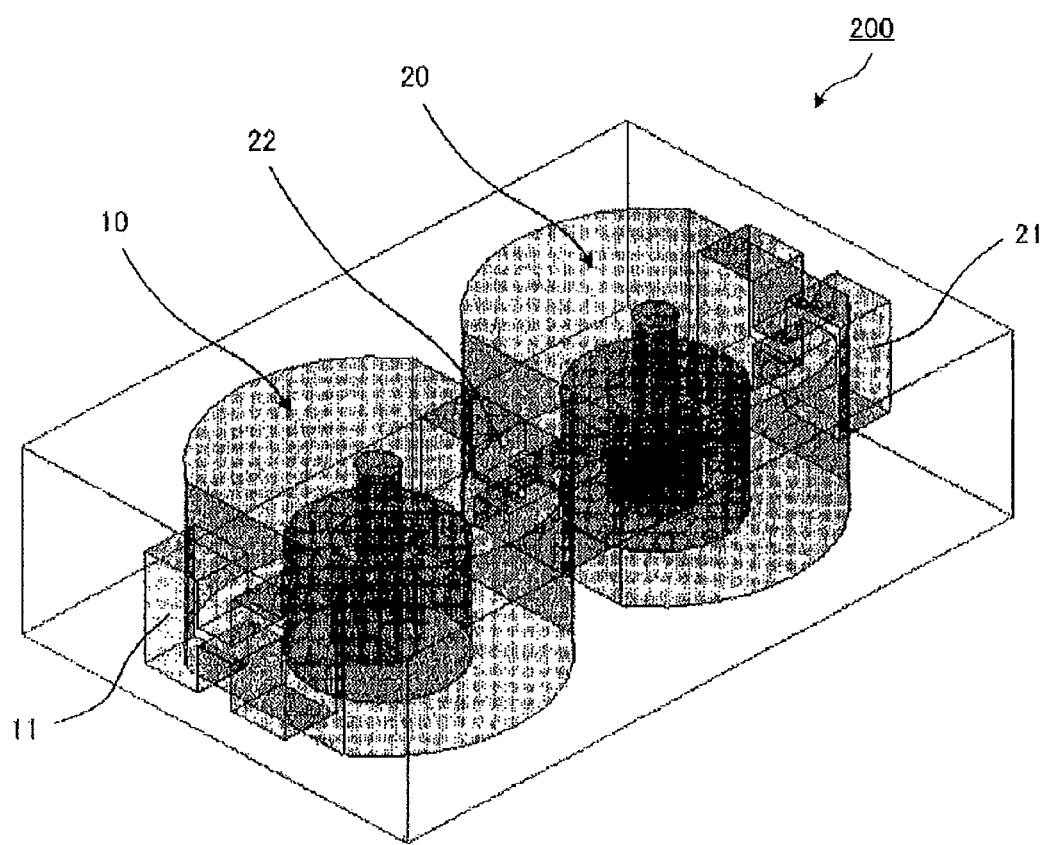
FIG. 6 is a transparent perspective view of a high-frequency limiter according to a second embodiment.
Figure 7A:
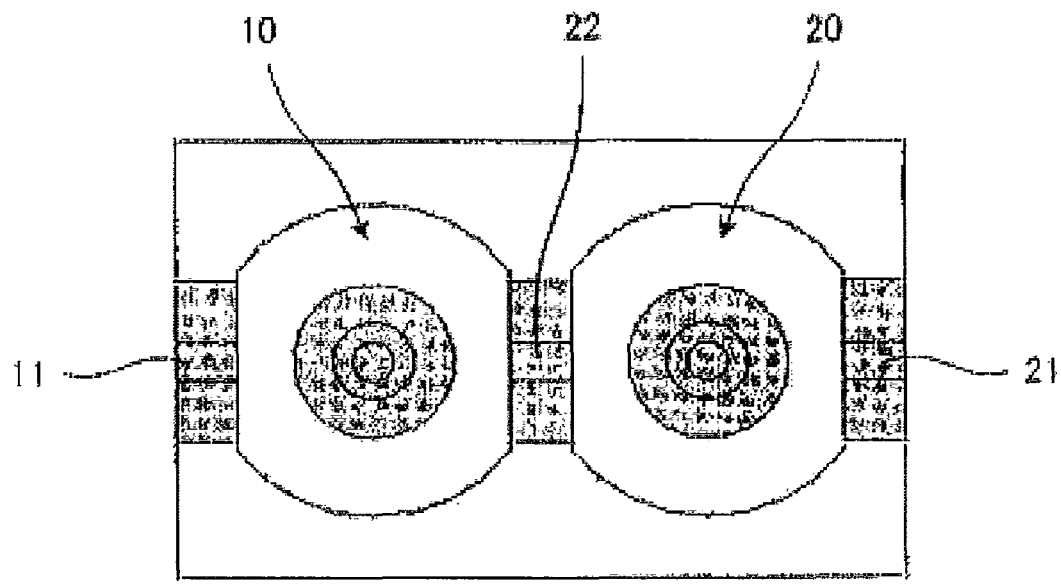
FIG. 7 is a transparent plan view and a transparent front view of the high-frequency limiter.
Figure 7B:
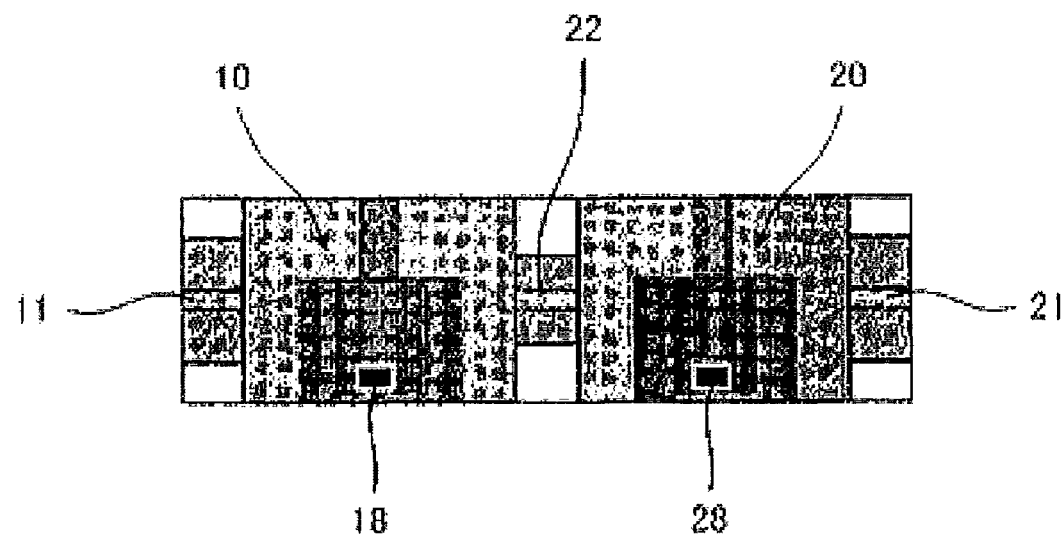

FIG. 6 is a transparent perspective view of a high-frequency limiter according to a second embodiment. FIG. 7(A) is a transparent plan view of the high-frequency limiter and FIG. 7(B) is a transparent front view.

This high-frequency limiter 200 according to the second embodiment includes two resonator parts 10 and 20, and a resonance window 11 is provided between the first resonator part 10 and a waveguide (not illustrated), a resonance window 21 is provided between the second resonator part 20 and a waveguide (not illustrated), a resonance window 22 is provided between the first and second resonator parts 10 and 20.

The configurations of the first resonator part 10 and the second resonator part 20 are fundamentally the same as what are shown in the first embodiment. For the first resonator part 10 and the second resonator part 20, the external pedestal, the internal pedestal, and the post are made in the same size between the parts, but the inner diameter of the cavity are made different from each other.

The resonance window 22 between the first and second resonator parts 10 and 20 is formed in the shape of an H-shaped resonance window similar to the resonance windows 11 and 21 adjacent to the waveguides.

Thus, by making a subordinate connection of the two multi section re-entrant coaxial cavities with which the inner diameters of the cavities differ from each other, a synthetic characteristic of the respective resonators can be acquired. Therefore, the parameters for the characteristic adjustment double to allow the limiting characteristic to be adjusted more broadly.

<<Third Embodiment>>

Figure 8A:
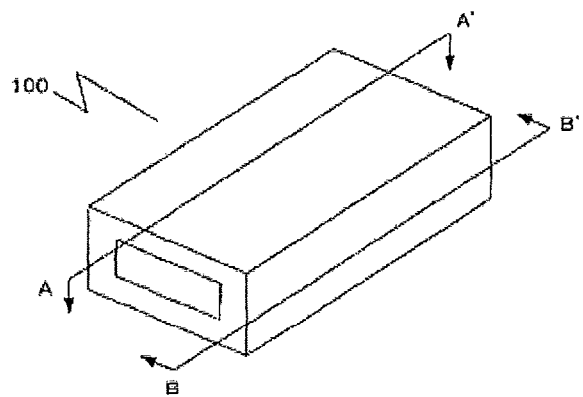
FIG. 8 is a view showing an example of a high-frequency limiter according to a third embodiment of the present invention.
Figure 8B:
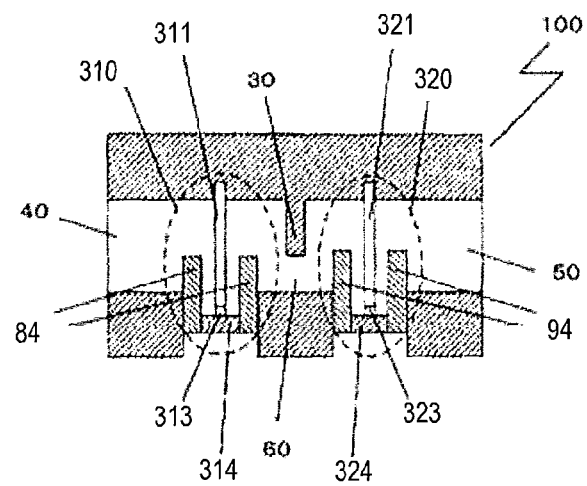
Figure 8C:
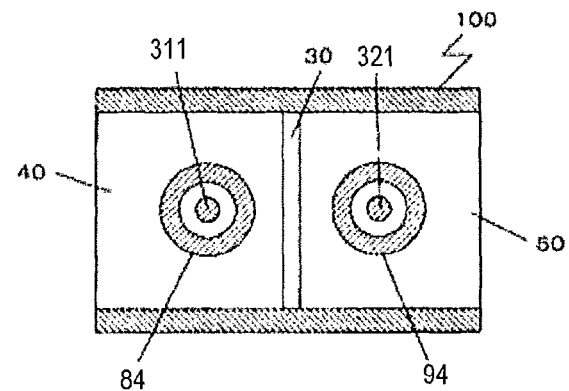

A high-frequency limiter according to a third embodiment of the present invention will be described using FIG. 8 through FIG. 11. FIG. 8 is views showing an example of the high-frequency limiter according to the third embodiment of the present invention, where FIG. 8(*a*) is a perspective view of the high-frequency limiter according to the third embodiment of the present invention, FIG. 8(*b*) is an A-A' cross-sectional view of the high-frequency limiter, and FIG. 8(C)$_{[ipto2]}$ is a B-B' cross-sectional view of the high-frequency limiter.

The high-frequency limiter 100 according to the third embodiment of the present invention is a high-frequency limiter using a coaxial stub-type resonator, and it is constituted by providing in a waveguide having a rectangular waveguide path a first resonance part 310, a resonance part 320, a partition 30, an input part 40, and an output part 50.

The resonance part 310 includes a central conductor 311 and an outer conductor 84 arranged around thereof, and a PIN diode 313 having a thick I-layer with a sufficient power-proof characteristic is loaded inside the central conductor 311. Note that the resonance part 310 described herein is a coaxial resonator where the outer conductor 84 is arranged around the central conductor 311 so that a part of the central conductor 311 projects therefrom. In order to adjust positions of the pedestal 314 of the central conductor 311 and the outer conductor 84 in the height direction, the pedestal 314 of the central conductor 311 and the outer conductor 84 are threadedly engaged with each other, for example.

The resonance part 320 includes a central conductor 321 and an outer conductor 94 arranged around thereof, and a PIN diode 323 having a thin I-layer with a sufficient cutoff characteristic is loaded inside the central conductor 311$_{[ipto3]}$. Note that the resonance part 320 of the present invention is, as similar to the resonance part 310, a coaxial resonator where the outer conductor 94 is arranged around the central conductor 321 so that a part of the central conductor 321 projects therefrom. In order to adjust positions of the pedestal 324 of the central conductor 321 and the outer conductor 94 in the height direction, the pedestal 324 of the central conductor 321 and the outer conductor 94 are threadedly engaged with each other, for example.

The high-frequency limiter 100 of the present invention simultaneously realizes a tolerance over a high power and a short response time (sufficient cutoff characteristic) by arranging the resonance part 310 given with such a power-proof characteristic and the resonance part 320 given with such a cutoff characteristic along the transmission direction of the electric wave and electrically coupling with each other.

Figure 9:
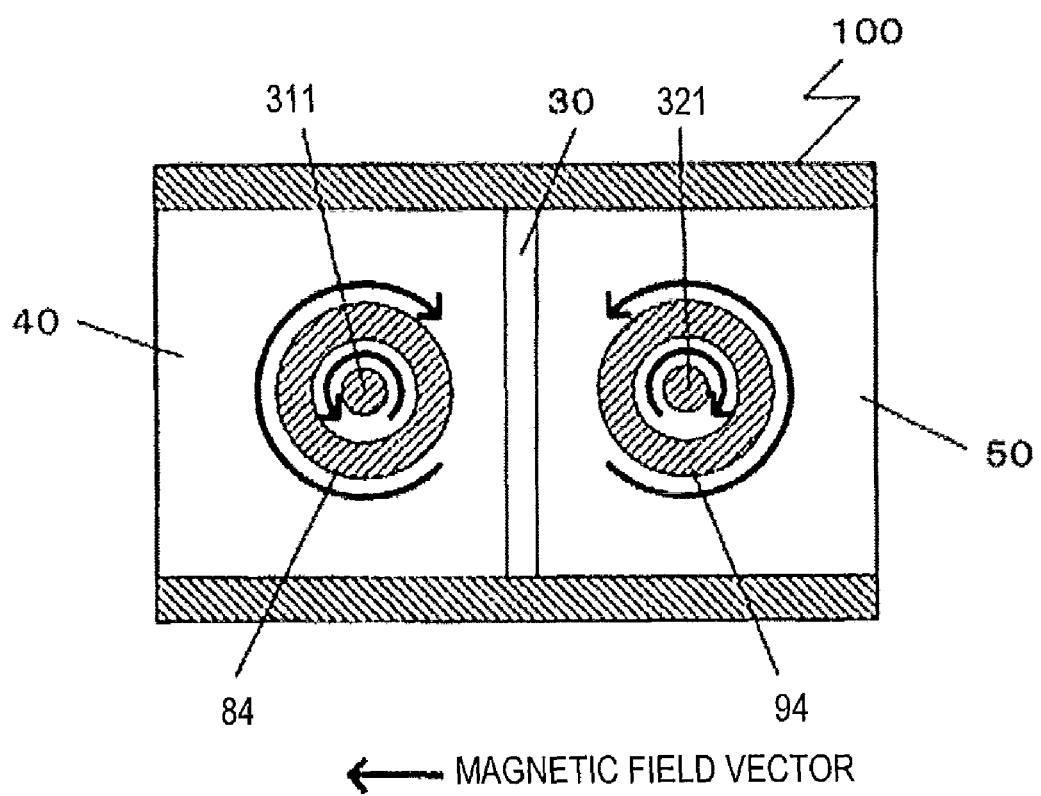
FIG. 9 is a view showing a magnetic field distribution of the high-frequency limiter according to the third embodiment of the present invention.

The partition 30 is formed with a coupling hole 60 for coupling the resonance part 310 and the resonance part 320, which are adjacent to each other, in an even mode. The coupling hole 60 is a rectangular window formed by the waveguide, the inner wall, and the partition 30 which form a waveguide path, and it is formed in a shape where resonance does not take place within a frequency band of the electromagnetic wave being transmitted inside the high-frequency limiter 100. FIG. 9 is a conceptual diagram showing a magnetic field distribution when the high-frequency limiter 100 of the present invention is viewed from above. As illustrated, by controlling with the partition 30 the coupling of the electromagnetic field of the resonance part 310 and the electromagnetic field of the resonance part 320, the magnetic field distributions are coupled together in the even mode which is horizontally symmetrical with respect to the partition 30.

Next, the high-frequency limiter 100 of the present invention will be described using an equivalent circuit.

Figure 10:
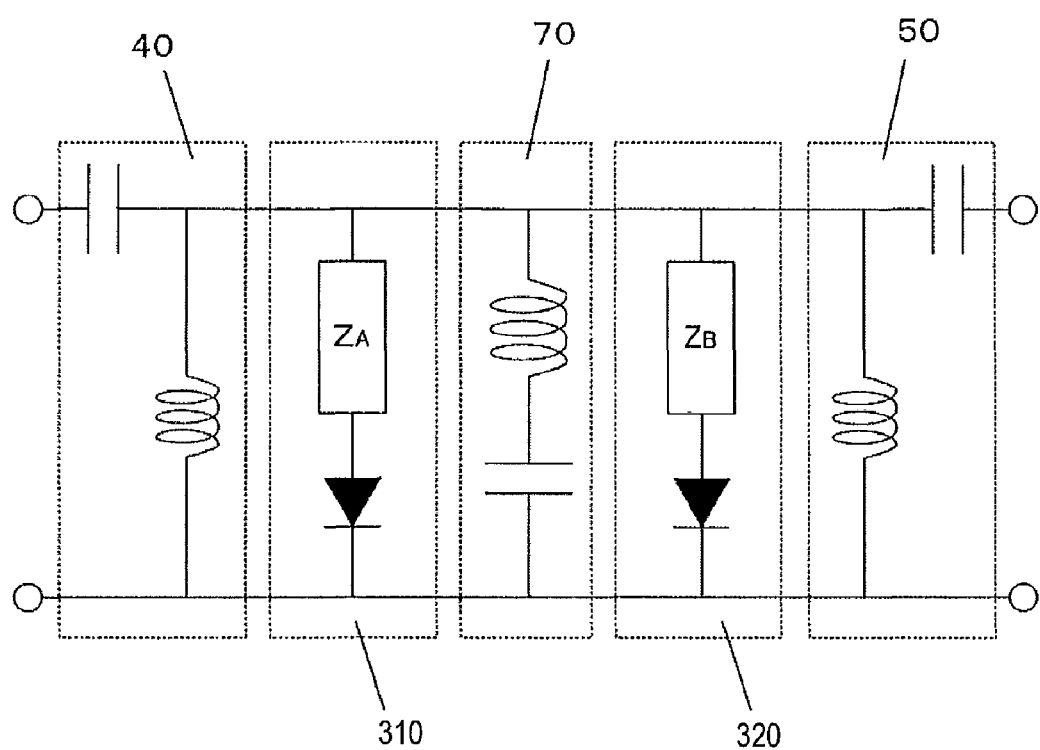
FIG. 10 is a view showing an equivalent circuit of the high-frequency limiter according to the third embodiment of the present invention.

FIG. 10 shows the equivalent circuit of the high-frequency limiter 100 according to the third embodiment of the present invention.

The reference numerals given in FIG. 10 correspond to those of the configuration of the high-frequency limiter 100. "70" corresponds to the coupling hole 60 formed by the partition 30. "ZA" in the figure indicates impedance of the resonance part 310 to which the PIN diode 313 is connected, and "ZB" indicates impedance of the resonance part 320 to which the PIN diode 323 is connected.

Because the coupling hole 60 formed by the partition 30 functions to combine the resonance part 310 and the resonance part 320 in the even mode, which makes an equivalent circuit in which a coil is connected with the capacitor in series as shown by "70" in FIG. 10. This equivalent circuit has a low-pass characteristic for intercepting a high-frequency range component higher than a certain frequency as being well-known. Therefore, because the high-frequency limiter 100 shown in FIG. 10 has the low-pass characteristic for intercepting the high-frequency range component higher than the certain frequency, while the impedance of the diode changes according to the input power, it can acquire a sufficient transmission characteristic and a sufficient cutoff characteristic. In addition, because the coupling hole 60 has a shape where the resonance does not take place within the frequency band of the electromagnetic wave being transmitted, the limiter can simultaneously realize the band expansion of the cutoff characteristic without having unnecessary resonance mode.

Next, the effects of the high-frequency limiter 100 of the present invention will be shown.

FIG. 11 is diagrams illustrating the effects of the high-frequency limiter 100 of the present invention, and shows the loss of the input signal when designing the high-frequency limiter by setting a transmission frequency range of the magnetron to around 9.4 GHz. FIG. 11(*a*) shows the loss for each frequency when providing the partition between the resonance parts and coupling the adjacent electromagnetic fields of the resonance parts in the even mode, and FIG. 11(*b*) shows the loss for each frequency when not providing the partition between the resonance parts but coupling the adjacent electromagnetic fields of the resonance parts in the odd-number mode. Note that the solid lines in FIG. 11 show a cutoff characteristic and the dashed lines show a transmission characteristic.

An ideal high-frequency limiter used with a radar device is required to have a bandpass-filter-type transmission characteristic for allowing a signal component within only the transmission frequency range of the magnetron to pass through at the time of a small-power input, and to have a low-pass-filter-type cutoff characteristic for intercepting both the transmission frequency of the magnetron and frequencies higher than this at the time of a high-power input.

Figure 11A:
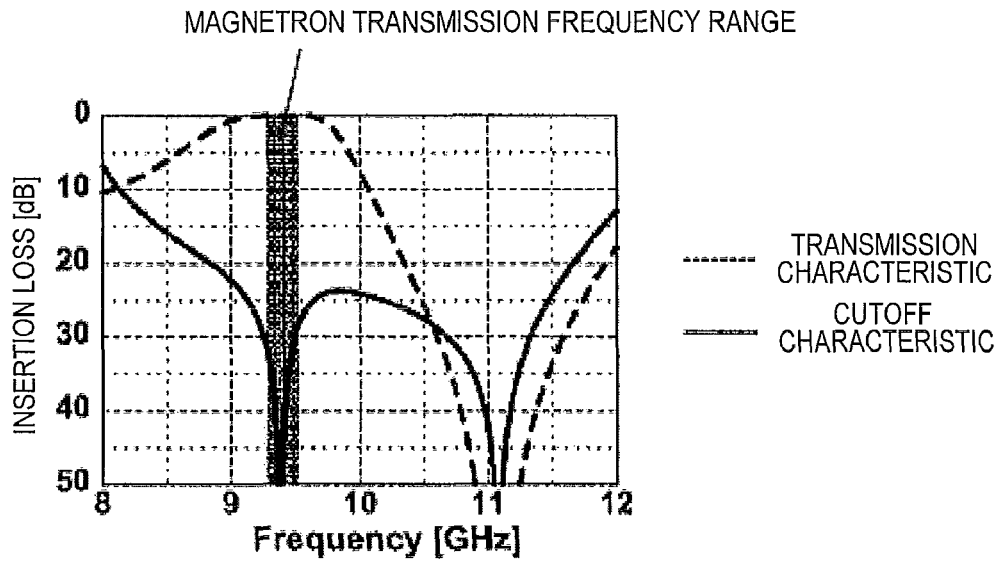
FIG. 11 is views showing a loss for each frequency when coupling electromagnetic fields of adjacent coaxial resonators in an even mode and an odd-number mode.
Figure 11B:
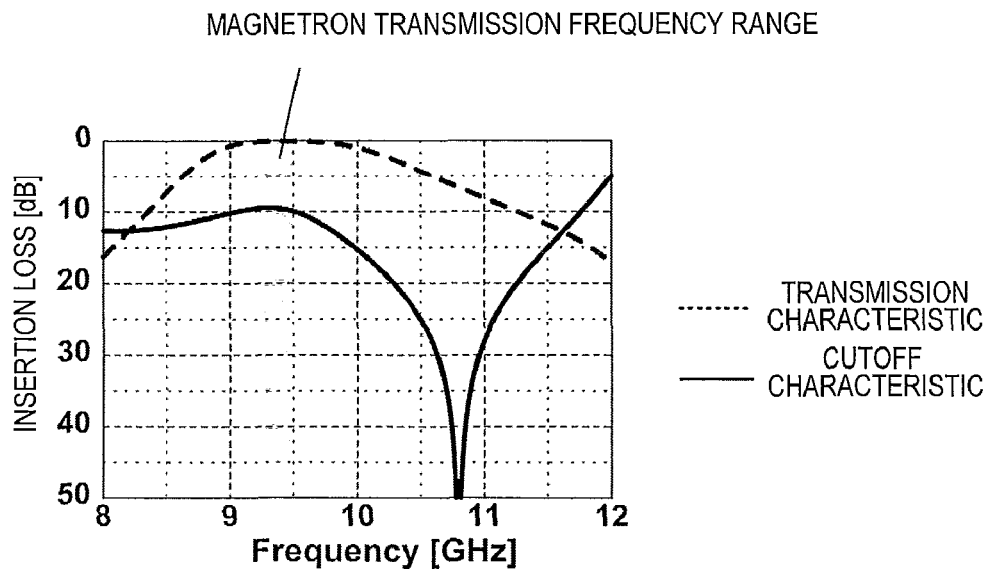

In the case of the odd-number mode shown in FIG. 11(b), it has the cutoff characteristic for allowing only the transmission frequency range of the magnetron to pass through at the time of the small-power input, but it will allow the signal component of the transmission frequency of the magnetron to pass through also at the time of the high-power input. Moreover, also in a frequency area higher than the transmission frequency of the magnetron, it will allow a signal component of a high frequency to pass through at the time of the high-power input, compared with the case where the electromagnetic fields of the resonance parts are coupled in the even mode.

On the other hand, in the case of the even mode shown in FIG. 11(a), it has the cutoff characteristic for allowing only the transmission frequency range of the magnetron to pass through at the time of the small-power input, and intercept the signal component of the transmission frequency of the magnetron at the time of the high-power input. At the time of the high-power input, the high-frequency range component higher than the predetermined frequency can also be intercepted as compared with the case of the odd-number mode coupling.

As described above, it does not have unnecessary resonance mode by setting the coupling mode of the adjacent resonance parts as the even mode coupling, but can expand the cutoff characteristic in band as compared with the case of the odd-number mode coupling.

<<Fourth Embodiment>>

Next, a high-frequency limiter according to a fourth embodiment of the present invention will be described using FIG. 12 through FIG. 15.

Figure 12A:
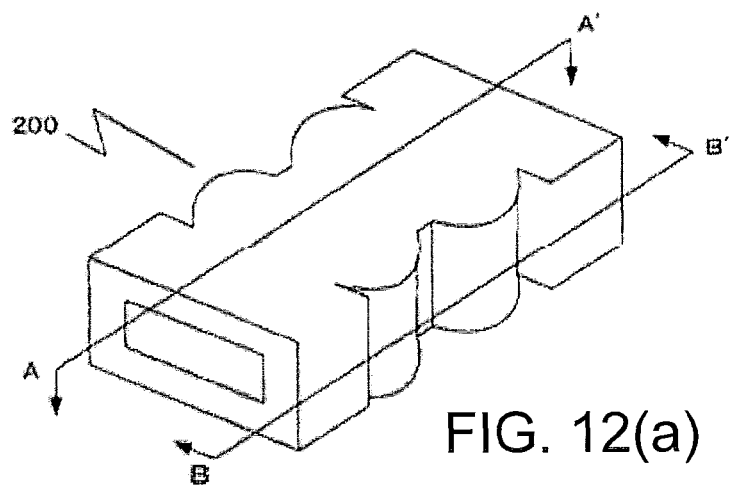
FIG. 12 is a view showing an example of a high-frequency limiter according to a fourth embodiment of the present invention.
Figure 12B:
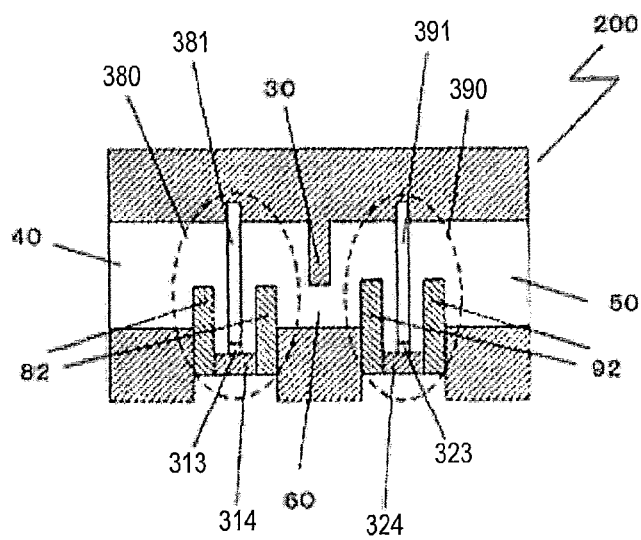
Figure 12C:
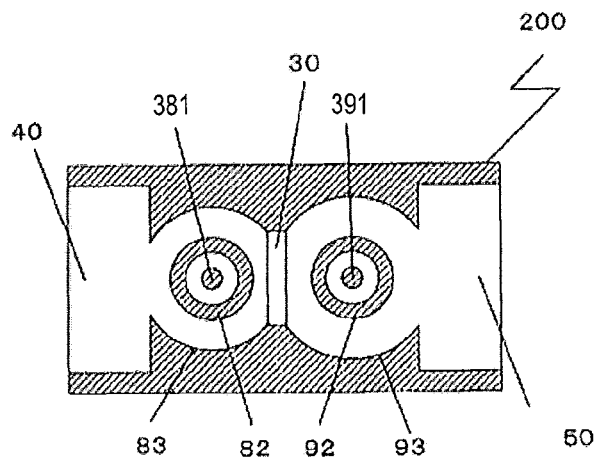

FIG. 12 is views showing an example of the high-frequency limiter according to the fourth embodiment of the present invention, where FIG. 12(a) is a perspective view of the high-frequency limiter according to the fourth embodiment of the present invention, FIG. 12(b) is an A-A' cross-sectional view of the high-frequency limiter, FIG. 12(C)$_{[ipto4]}$ is a B-B' cross-sectional view of the high-frequency limiter.

The high-frequency limiter 200 according to the fourth embodiment of the present invention is a high-frequency limiter using a re-entrant coaxial cavity, and includes a resonance part 380, a resonance part 390, a partition 30, an input part 40, and an output part 50. Note that the high-frequency limiter 200 according to the fourth embodiment of the present invention is configured by changing the configurations of the resonance part 380 and the resonance part 390$_{[ipto5]}$ of the high-frequency limiter 100 according to the third embodiment, and other constituent components are the same. Therefore, the same reference numerals are assigned herein and explanation thereof is omitted.

The resonance part 380 is a re-entrant coaxial cavity having a central conductor 381 loaded with a diode 13$_{[ipto6]}$ having a thick I-layer with a sufficient power-proof characteristic, and an inner external conductor 82 and an outer external conductor 83 oppositely arranged around the central conductor 381 so that a part of the central conductor 381 projects therefrom. In order to adjust the positions of the pedestal 314 of the central conductor 381 and the inner external conductor 82 in the height direction, the resonance part 380 is formed by threadedly engaging the pedestal 314 of the central conductor 381 and the inner external conductor 82 with each other, for example.

The resonance part 390 is a re-entrant coaxial cavity having a central conductor 391 loaded with a diode 23$_{[ipto7]}$ having a thin I-layer with a sufficient cutoff characteristic, and an inner external conductor 92 and an outer external conductor 93 are oppositely arranged around the central conductor 391 so that a part of the central conductor 391 projects therefrom. In order to adjust the positions of the pedestal 314 of the central conductor 391 and the inner external conductor 92 in the height direction, the resonance part 390 is formed by threadedly engaging the pedestal 314 of the central conductor 391 and the inner external conductor 92 with each other, for example.

Figure 13:
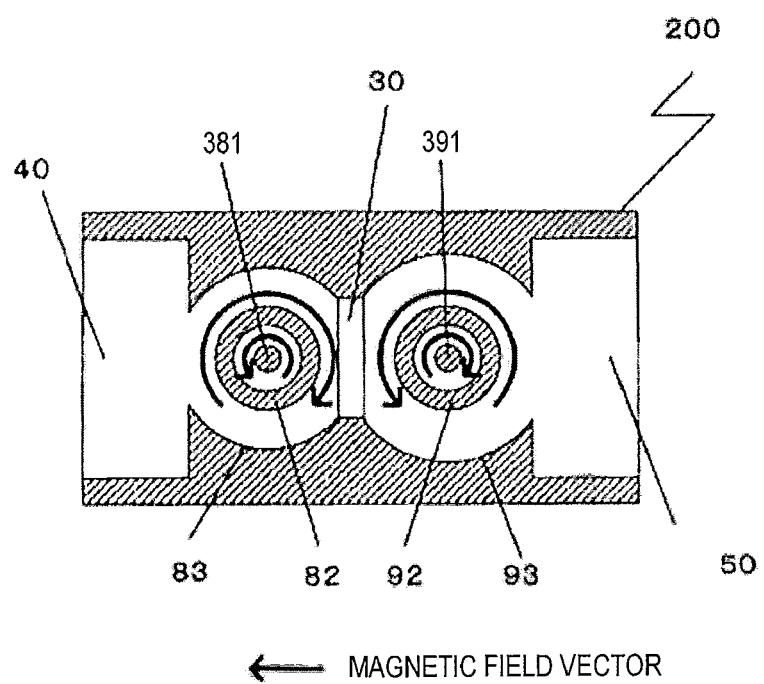
FIG. 13 is a view showing a magnetic field distribution of the high-frequency limiter according to the fourth embodiment of the present invention.

A magnetic field distribution of the high-frequency limiter 200 provided with the partition 30 between the resonance part 380 and the resonance part 390 is shown in FIG. 13. FIG. 13 is a conceptual diagram showing the magnetic field distribution when the high-frequency limiter 200 of the present invention is viewed from above. As illustrated, by controlling with the partition 30 the electromagnetic field of the resonance part 380 and the electromagnetic field of the resonance part 390, the magnetic field distributions are coupled together in the even mode which is horizontally symmetrical with respect to the partition 30.

Next, the high-frequency limiter 200 of the present invention will be described using an equivalent circuit.

Figure 14:
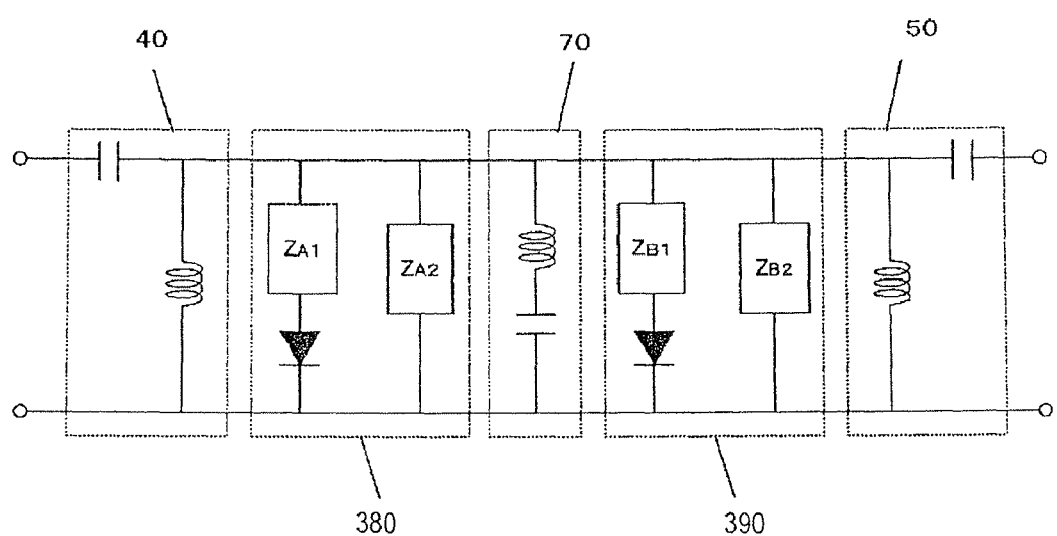
FIG. 14 is a view showing an equivalent circuit of the high-frequency limiter according to the fourth embodiment of the present invention.

FIG. 14 is an equivalent circuit showing the high-frequency limiter of the present invention.

Reference numerals given in FIG. 14 correspond to those of the configurations of the high-frequency limiter 200, respectively, and "70" corresponds to an arrangement part of the coupling hole 60 formed by the partition 30. Note that ZA1 and ZA2 in the figure indicate impedances of the resonance part 380 to which the PIN diode 313 is connected. ZA1 indicates an impedance of an inner resonator including the central conductor 381 and the inner external conductor 82, and ZA2 indicates an impedance of an outer resonator including the inner external conductor 82 and the outer external conductor 83. Further, ZB1 and ZB2 indicate impedances of the resonance part 390 to which the PIN diode 313 is connected. ZB1 indicates an impedance of an inner resonator including the central conductor 391 and the inner external conductor 92, and ZB2 indicates an impedance of an outer resonator including the inner external conductor 92 and the outer external conductor 93.

The coupling hole 60 formed by the partition 30 serves, in order to achieve the function for coupling the resonance part 380 and the resonance part 390 in the even mode, as an equivalent circuit where a coil is connected with a capacitor in series as shown by "70" in FIG. 14. This equivalent circuit has a low-pass characteristic for intercepting a high-frequency range component higher than a certain frequency as being well-known. Therefore, because the high-frequency limiter 200 shown in FIG. 14 has the low-pass characteristic for intercepting the high-frequency range component higher than the certain frequency and the impedance of the diode changes according to the input power, it can acquire a sufficient transmission characteristic and a sufficient cutoff characteristic. In addition, because the coupling hole 60 has a shape such that resonance does not take place within the frequency band of the electromagnetic wave being transmitted, it can simultaneously realize the band expansion of the cutoff characteristic without having unnecessary resonance mode.

Next, the effects of the high-frequency limiter 200 of the present invention will be shown.

Figure 15A:
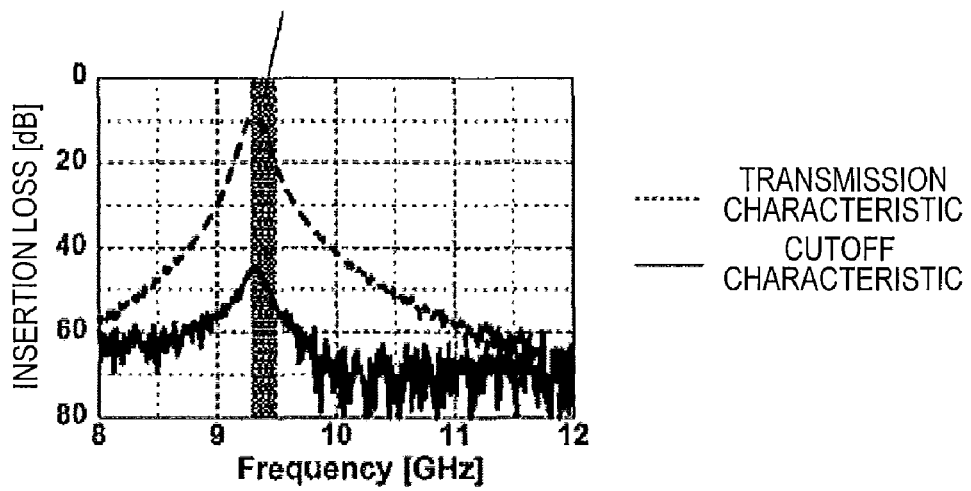
FIG. 15 is views showing a loss for each frequency when coupling electromagnetic fields of adjacent re-entrant coaxial cavities in an even mode and an odd-number mode.
Figure 15B:
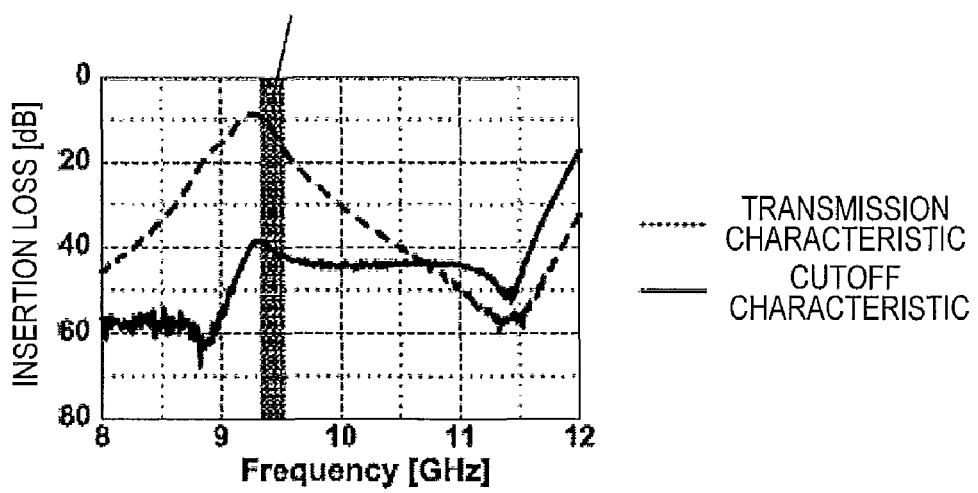
Figure 16A:
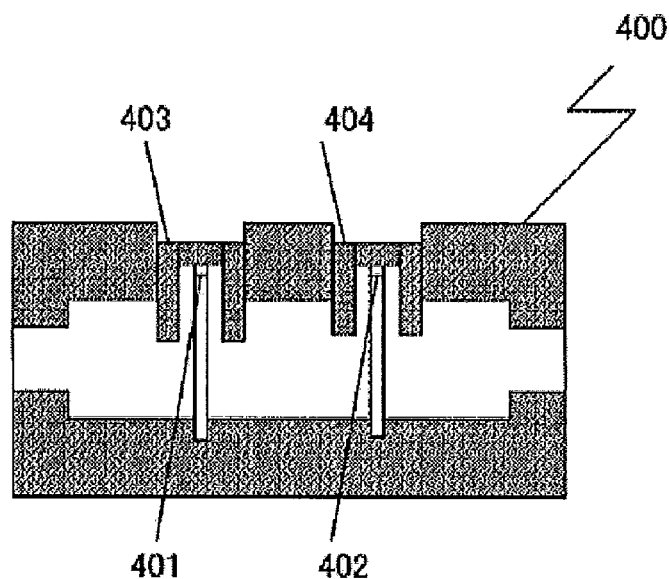
FIG. 16 is a view showing a configuration of a conventional high-frequency limiter.
Figure 16B:
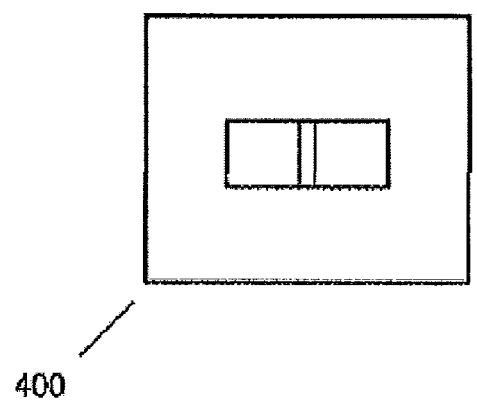
Figure 17:
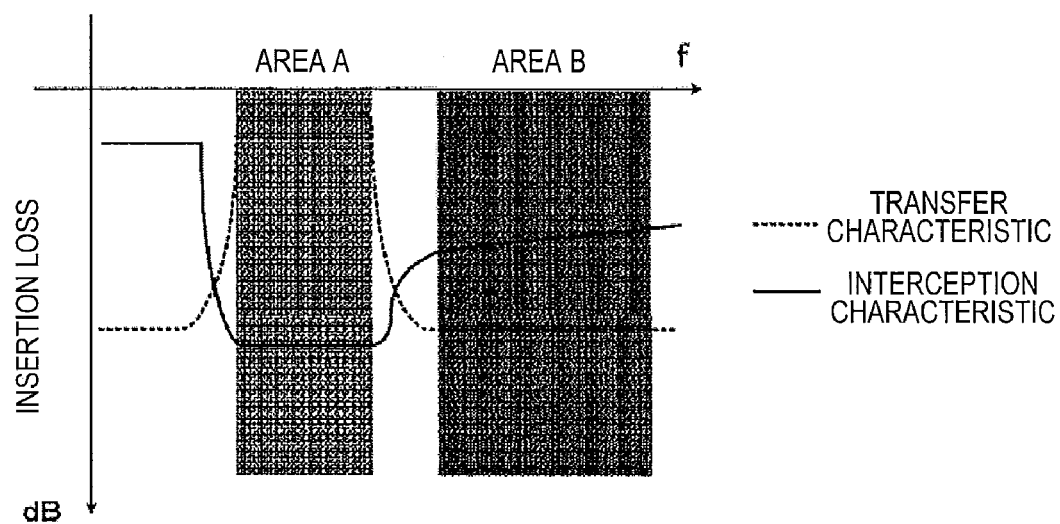
FIG. 17 is a view showing a loss for each frequency of the conventional high-frequency limiter.

FIG. 15 is diagrams illustrating the effects of the high-frequency limiter 200 of the present invention, and shows a loss of the input signal when designing a high-frequency limiter by setting the transmission frequency range of the magnetron around 9.4 GHz. FIG. 15(a) shows the loss for each frequency when providing the partition between the resonance parts and coupling the electromagnetic fields of the adjacent resonance parts in the even mode, and FIG. 15(b) shows the loss for each frequency when not providing the partition between the resonance parts but coupling the electromagnetic fields of the adjacent resonance parts in the odd-number mode. Note that the solid lines in FIG. 15 show the cutoff characteristic and the dashed lines show the transmission characteristic.

An ideal high-frequency limiter used with a radar device is required to have a bandpass-filter-type transmission characteristic for allowing the signal component within only the transmission frequency range of the magnetron to pass through at the time of a small-power input, and to have a low-pass-filter-type cutoff characteristic for intercepting both the transmission frequency of the magnetron and frequencies higher than this at the time of a high-power input.

In the case of the odd-number mode shown in FIG. 15(b), it has the cutoff characteristic for allowing only the transmission frequency range of the magnetron to pass through at the time of the small-power input, but it has the high-pass-filter-type characteristic for allowing the signal component of the transmission frequency of the magnetron and the frequencies higher than this to pass through at the time of a high-power input.

On the other hand, as for the case in the even mode shown in FIG. 15(a), it has the bandpass filter characteristic at the time of the small-power input, while acquiring the low-pass filter characteristic for intercepting the high-frequency range component higher than the frequency predetermined at the time of the high-power input.

Thus, by setting the coupling mode of the adjacent resonance parts as the even mode coupling, it can expand the cutoff characteristic in band as compared with the case of the odd-number mode coupling without having the unnecessary resonance mode.

Note that in the third and fourth embodiments of the present invention, although the configurations which have the same configurations as the resonance part 310 and the resonance part 320 are described, they may be a configuration where the aligned resonance parts have different configurations from each other, and the resonance part may at least have a configuration including the central conductor loaded with the PIN diode and an outer conductor arranged oppositely surrounding the central conductor.

Further, although, in the third and fourth embodiments of the present invention, the high-frequency limiter in which the two resonance parts are arranged along the transmission direction of the electromagnetic wave is described, three or more resonance parts may also be arranged in the direction.

Moreover, the present invention may freely be changed in design without deviating from the subject of the present invention described in each embodiment of the present invention and, thus, is not limited to the configuration described in each embodiment of the present invention.

INDUSTRIAL APPLICABILITY

As described above, the present invention is suitable for a radar device using a high-frequency limiter capable of expanding an adjustable range of the limiting characteristic to absorb variations in characteristic parameters of a PIN diode nearly completely to acquire a desired limiting characteristic, and suppressing generation of unnecessary resonance mode to expand a cutoff characteristic in band.

What is claimed is:

1. A high-frequency limiter for limiting power of a high frequency signal propagating in a waveguide at a predetermined upper limit, comprising:
   a resonator part to which a first waveguide into which the high frequency signal comes and a second waveguide for outputting the high frequency signal to be propagated are connected;
   wherein the resonator part includes at least one multi section re-entrant coaxial cavity, the multi section re-entrant coaxial cavity includes:
   an internal re-entrant coaxial cavity having a central conductor and a pedestal opposing to the central conductor, that are coaxially arranged; and
   an external re-entrant coaxial cavity having a cavity of the resonator part and the pedestal;
   wherein a PIN diode is connected between the central conductor and the pedestal of the internal re-entrant coaxial cavity, and the PIN diode is provided so as to adjust individually a projected amount of the central conductor toward the internal re-entrant coaxial cavity and a projected amount of the pedestal with respect to the cavity.

2. The high-frequency limiter of claim 1, wherein the resonator part includes a first resonator part to which the first waveguide into which the high frequency signal comes is connected, and a second resonator part coupled with the first re-entrant coaxial cavity and to which the second waveguide for outputting the high frequency signal to be propagated is connected, and the first and second resonator parts have different inner diameters of the cavity from each other.

3. The high-frequency limiter of claim 2, comprising a first resonance window for matching conditions between the first waveguide and the first resonator part, a second resonance window for matching conditions between the second waveguide and the second resonator part, and a third resonance window for matching conditions between the first and second resonator parts.

4. The high-frequency limiter of claim 2, wherein a partition provided between the first resonator part and the second resonator part is formed with a coupling hole for intercepting a high-frequency range component higher than a predetermined frequency.

5. The high-frequency limiter of claim 4, wherein the coupling hole couples electromagnetic fields of the adjacent resonance parts in an even mode.

6. The high-frequency limiter of claim 4, wherein the coupling hole has a rectangular shape.

* * * * *